United States Patent
Arakelyan et al.

(10) Patent No.: US 12,125,682 B2
(45) Date of Patent: Oct. 22, 2024

(54) SUBSTRATE TREATING APPARATUS AND SUBSTRATE TREATING METHOD

(71) Applicant: SEMES CO., LTD., Chungcheongnam-do (KR)

(72) Inventors: Shant Arakelyan, Chungcheongnam-do (KR); Ja Myung Gu, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 221 days.

(21) Appl. No.: 17/563,161

(22) Filed: Dec. 28, 2021

(65) Prior Publication Data
US 2022/0208525 A1    Jun. 30, 2022

(30) Foreign Application Priority Data

Dec. 29, 2020    (KR) .......................... 10-2020-0186249

(51) Int. Cl.
*H01J 37/32*    (2006.01)

(52) U.S. Cl.
CPC .. *H01J 37/32458* (2013.01); *H01J 37/32091* (2013.01); *H01J 37/32165* (2013.01); *H01J 37/3244* (2013.01); *H01J 37/32532* (2013.01)

(58) Field of Classification Search
CPC .......... H01J 37/32458; H01J 37/32091; H01J 37/32165; H01J 37/3244; H01J 37/32532; H01J 37/32183; H01J 37/32642; H01J 37/32449; H01J 37/32715; H01J 2237/3341; H01L 21/67069; H03H 7/40
See application file for complete search history.

(56) References Cited

U.S. PATENT DOCUMENTS

2014/0320016 A1*  10/2014  Chang ............... H01J 37/32541
                                                          315/111.41
2018/0033594 A1*   2/2018  Gu .................... H01J 37/32091
(Continued)

FOREIGN PATENT DOCUMENTS

CN    101237742 B  *  5/2011   ........ H01J 37/32183
JP       3704894 B2    10/2005
(Continued)

OTHER PUBLICATIONS

Korean Office Action issued in corresponding KR Patent Application No. 10-2020-0186249, dated Aug. 25, 2023.

*Primary Examiner* — Abdullah A Riyami
*Assistant Examiner* — Syed M Kaiser
(74) *Attorney, Agent, or Firm* — Carter, DeLuca & Farrell LLP

(57) ABSTRACT

The inventive concept provides a substrate treating apparatus. The substrate treating apparatus includes a process chamber having a treating space therein; a support unit for supporting a substrate within the process chamber; a gas supply unit for supplying a process gas inside the process chamber; and a plasma generation unit for generating a plasma from the process gas, wherein the plasma generation unit comprises: a top electrode disposed above the substrate; a bottom electrode disposed below the substrate; an edge electrode disposed at an edge surrounding the substrate; three high frequency power sources applying a high frequency power to the bottom electrode; and an edge impedance control circuit connecting to the edge electrode.

8 Claims, 6 Drawing Sheets

(56) References Cited

U.S. PATENT DOCUMENTS

| 2018/0102238 A1* | 4/2018 | Gu ................... H01J 37/32174 |
| 2018/0330930 A1* | 11/2018 | Murakami ............. B08B 9/027 |
| 2021/0233769 A1* | 7/2021 | Yamazaki ............. H01L 29/517 |

FOREIGN PATENT DOCUMENTS

| JP | 2013-143432 A | | 7/2013 | |
|----|---------------|---|--------|---|
| JP | 2020009960 A | * | 1/2020 | |
| KR | 10-2007-0020329 A | | 2/2007 | |
| KR | 101054558 B1 | * | 8/2011 | ........ H01J 37/32174 |
| KR | 10-2018-0019255 A | | 2/2018 | |
| KR | 20190033672 A | * | 4/2019 | ........ H01J 37/32009 |
| KR | 10-2020-0028288 A | | 3/2020 | |

\* cited by examiner

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2020-0186249 filed on Dec. 29, 2020, in the Korean Intellectual Property Office, the entire contents of which are hereby incorporated by reference.

BACKGROUND

Embodiments of the inventive concept described herein relate to a substrate treating apparatus and substrate treating method.

The semiconductor manufacturing process may include a process of treating a substrate using a plasma. For example, during the semiconductor manufacturing process, an etching process may remove a thin film on the substrate using the plasma. The plasma refers to an ionized gas state generated by a very high temperature, strong electric or high frequency electromagnetic fields, and formed of ions, electrons, radicals, or the like. In the semiconductor manufacturing process, the etching process is performed using the plasma. The etching process is performed by colliding ion particles contained in the plasma with the substrate.

For example, a Capacitively Coupled Plasma (CCP) type plasma source may be used for a plasma generation. When a high aspect ratio (HAR) etching is to be performed in the CCP type plasma source, a high ion energy distribution (IED) obtained by increasing a RF power is required. However, at a higher RF power, RF problems such as arc generation are common. Therefore, another method of increasing the IED is required.

SUMMARY

Embodiments of the inventive concept provide a substrate treating apparatus and method capable of obtaining a high aspect ratio and a high ion energy distribution.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a process chamber having a treating space therein; a support unit for supporting a substrate within the process chamber; a gas supply unit for supplying a process gas inside the process chamber; and a plasma generation unit for generating a plasma from the process gas, wherein the plasma generation unit comprises: a top electrode disposed above the substrate; a bottom electrode disposed below the substrate; an edge electrode disposed at an edge surrounding the substrate; three high frequency power sources applying a high frequency power to the bottom electrode; and an edge impedance control circuit connected to the edge electrode.

In an embodiment, the three high frequency powers sources comprise: a first frequency power source; a second frequency power source; and a third frequency power source, and wherein the first frequency power source has a range between 100 kHz to 400 kHz.

In an embodiment, the second frequency power source has a range between 2 MHz to 10 MHz.

In an embodiment, the third frequency power source has a range of 60 MHz or higher.

In an embodiment, the edge impedance control circuit has one or more notch filter(s), and a variable capacitor connected in parallel to the one or more notch filter(s).

In an embodiment, the edge impedance control circuit has one or more notch filter(s), and a high pass filter connected in parallel to the one or more notch filters(s).

In an embodiment, the one or more notch filers(s) block a frequency range of the first frequency power source and the second frequency power source, and the variable capacitor controls an impedance of the third frequency power source.

In an embodiment, one or more notch filter(s) block a frequency range of the first frequency power source and the second frequency power source, and the high pass filter controls an impedance of the third frequency power source and shunts a harmonics of the third frequency power source.

The inventive concept provides a substrate treating apparatus. The substrate treating apparatus includes a process chamber having a treating space therein; a support unit for supporting a substrate within the process chamber; a gas supply unit for supplying a process gas inside the process chamber; and a plasma generation unit for generating a plasma from the process gas, wherein the plasma generation unit comprises: a top electrode disposed above the substrate; a bottom electrode disposed below the substrate; and three high frequency powers power sources applying a high frequency power to the bottom electrode, and wherein the support unit comprises: an edge ring surrounding the substrate; a coupling ring disposed below the edge ring, and including an edge electrode therein; and an edge impedance control circuit connected to the edge electrode.

In an embodiment, the three high frequency power sources comprise: a first frequency power source; a second frequency power source; and a third frequency power source, and wherein the first frequency power source has a range of between 100 kHz and 400 kHz.

In an embodiment, the second frequency power source has a range between 2 MHz and 10 MHz.

In an embodiment, the third frequency power source has a range of 60 MHz or higher.

In an embodiment, the edge impedance control circuit has one or more notch filter(s), and a variable capacitor connected in parallel to the one or more notch filter(s).

In an embodiment, the edge impedance control circuit has one or more notch filter(s), and a high pass filter connected in parallel to the one or more notch filters(s).

In an embodiment, the one or more notch filers(s) block a frequency range of the first frequency power source and the second frequency power source, and the variable capacitor controls an impedance of the third frequency power source.

In an embodiment, one or more notch filter(s) block a frequency range of the first frequency power source and the second frequency power source, and the high pass filter controls an impedance of the third frequency power source and shunts a harmonics of the third frequency power source.

The inventive concept provides a substrate treating method using the substrate treating apparatus to generate the plasma within a process chamber. The substrate treating method includes controlling a first frequency of the first frequency power source and a second frequency of the second frequency power source without controlling a third frequency of the third frequency power source applied to the bottom electrode; and blocking the first frequency and the second frequency and controlling a high frequency impedance of the third frequency.

In an embodiment, the controlling the high frequency impedance of the third frequency comprises tuning the edge impedance control circuit.

In an embodiment, the first frequency has a range of 100 kHz and 400 kHz, and the second frequency is controlled to a range between 2 MHz to 10 MHz.

In an embodiment, the first frequency reduces from a first value to a second value lower than the first value. by the controlling According to the inventive concept, it is possible to obtain a high aspect ratio and a high ionic energy distribution.

The effects of the inventive concept are not limited to the above-described effects, and effects not mentioned will be clearly understood by those skilled in the art from the present specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
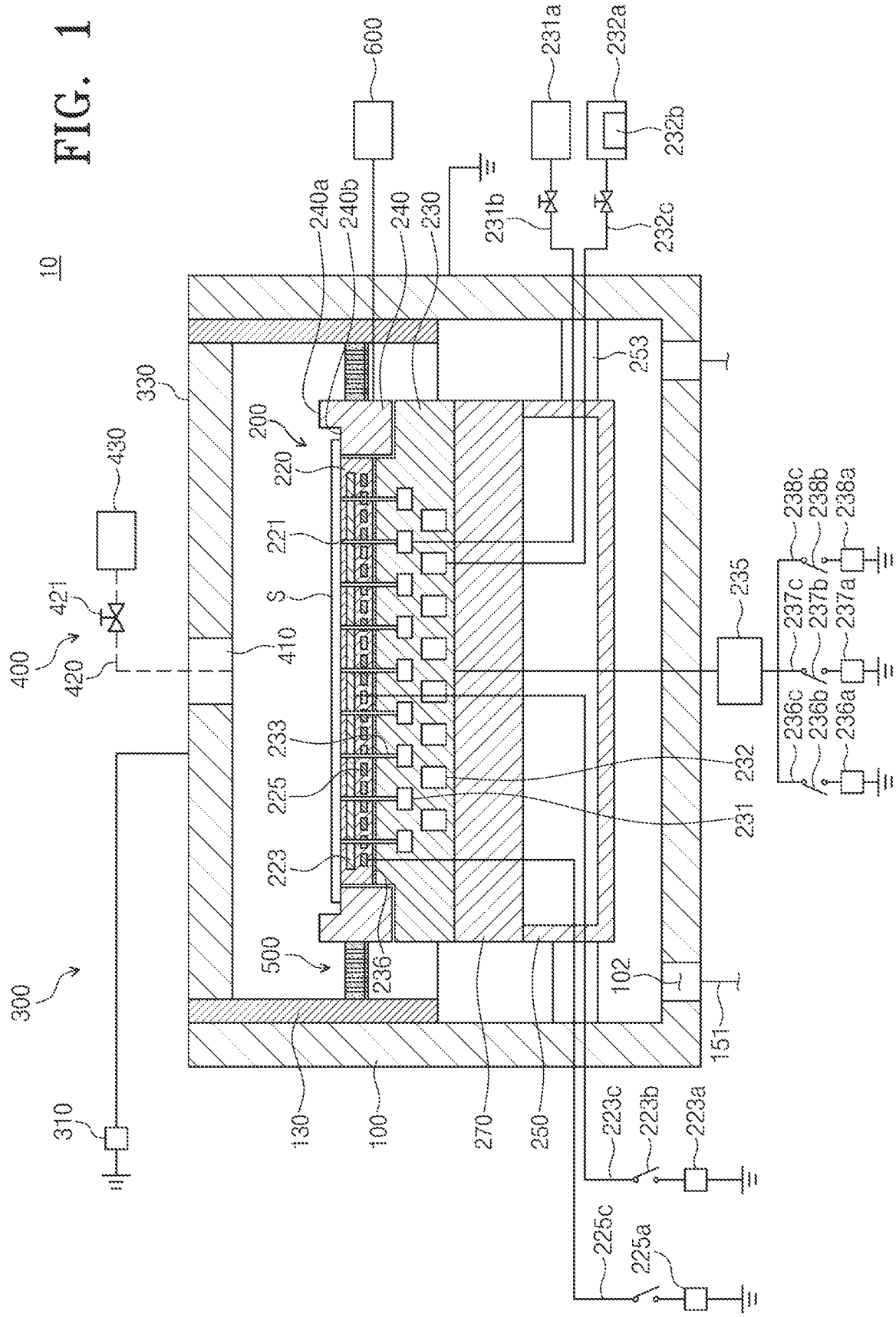
FIG. 1 is a view illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

FIG. 1 is an exemplary view illustrating a substrate treating apparatus according to an embodiment of the inventive concept.

FIG. 1 illustrates a substrate treating apparatus using a capacitively coupled plasma (CCP) treating method. Referring to FIG. 1, the substrate treating apparatus 10 treats the substrate S using a plasma. For example, the substrate treating apparatus 10 may perform an etching process on the substrate S. The substrate treating apparatus 10 may include a chamber 100, a substrate support assembly 200, a plasma generation unit 300, a gas supply unit 400, and a baffle unit 500.

The chamber 100 may provide a treating space in which a substrate treating process is performed. The chamber 100 may have a treating space therein and may be provided in a sealed shape. The chamber 100 may be made of a metal material. The chamber 100 may be made of an aluminum material. The chamber 100 may be grounded. An exhaust hole 102 may be formed on a bottom surface of the chamber 100. The exhaust hole 102 may be connected to an exhaust line 151. A reaction by-product generated during the process and a gas remaining in an inner space of the chamber may be discharged to an outside through the exhaust line 151. An inside of the chamber 100 may be depressurized to a predetermined pressure by the exhaust process.

According to an embodiment, a liner 130 may be provided inside the chamber 100. The liner 130 may have a cylindrical shape with an open top surface and an open bottom surface. The liner 130 may be provided to be in contact with an inner surface of the chamber 100. The liner 130 may protect an inner wall of the chamber 100 to prevent the inner wall of the chamber 100 from being damaged by the arc discharge. In addition, it is possible to prevent impurities generated during the substrate treating process from being deposited on the inner wall of the chamber 100.

The substrate support assembly 200 may be positioned inside the chamber 100. The substrate support assembly 200 may support the substrate S. The substrate support assembly 200 may include an electrostatic chuck 210 that sucks the substrate S using an electrostatic force. Alternatively, the substrate support assembly 200 may support the substrate S in various ways such as a mechanical clamping. Hereinafter, the substrate support assembly 200 including the electrostatic chuck 210 will be described.

The substrate support assembly 200 may include an electrostatic chuck 210, a bottom cover 250, and a plate 270. The substrate support assembly 200 may be positioned inside the chamber 100 to be upwardly spaced apart from the bottom surface of the chamber 100.

The electrostatic chuck 210 may include a dielectric plate 220, a body 230, and a focus ring 240. The electrostatic chuck 210 may support the substrate S.

The dielectric plate 220 may be positioned at a top end of the electrostatic chuck 210. The dielectric plate 220 may be provided as a disk-shaped dielectric substance. The substrate S may be disposed on a top surface of the dielectric plate 220. The top surface of the dielectric plate 220 may have a radius smaller than that of the substrate S. Therefore, an edge region of the substrate S may be located outside the dielectric plate 220.

The dielectric plate 220 may include a first electrode 223, a heater 225, and a first supply fluid channel 221 therein. The first supply fluid channel 221 may be provided from a top surface to a bottom surface of the dielectric plate 210. A plurality of first supply fluid channel 221 are formed to be spaced apart from each other, and may be provided as a passage through which a heat transfer medium is supplied to a bottom surface of the substrate S.

The first electrode 223 may be electrically connected to a first power source 223a. The first power source 223a may include a DC power. A switch 223b may be installed between the first electrode 223 and the first power source 223a. The first electrode 223 may be electrically connected to the first power source 223a by on/off of the switch 223b. When the switch 223b is turned on, a DC current may be applied to the first electrode 223. An electrostatic force is applied between the first electrode 223 and the substrate S by a current applied to the first electrode 223, and the substrate S may be sucked to the dielectric plate 220 by the electrostatic force.

The heater 225 may be located below the first electrode 223. The heater 225 may be electrically connected to the second power source 225a. The heater 225 may generate a heat by resisting a current applied from the second power source 225a. The generated heat may be transferred to the substrate S through the dielectric plate 220. The substrate S may be maintained at a predetermined temperature by the heat generated by the heater 225. The heater 225 may include a spiral shape coil.

The body 230 may be positioned below the dielectric plate 220. The bottom surface of the dielectric plate 220 and the top surface of the body 230 may be bonded by an adhesive 236. The body 230 may be made of an aluminum material. The top surface of the body 230 may be stepped such that a central region is positioned higher than the edge region. The central region of the top surface of the body 230 has an area corresponding to the bottom surface of the dielectric plate 220 and may be adhered to the bottom surface of the dielectric plate 220. The body 230 may have a first circulation fluid channel 231, a second circulation fluid channel 232, and a second supply fluid channel 233 formed therein.

The first circulation fluid channel 231 may be provided as a channel through which the heat transfer medium circulates. The first circulation fluid channel 231 may be formed in a spiral shape inside the body 230. Alternatively, the first circulation fluid channel 231 may be disposed such that ring-shaped channels having different radii have the same center. Each of the first circulation fluid channel 231 may communicate with each other. The first circulation fluid channel 231 may be formed at the same height. The second fluid channel 232 may be provided as a channel through which a cooling fluid circulates. The second circulation fluid channel 232 may be formed in a spiral shape inside the body 230. Alternatively, the second circulation fluid channel 232 may be disposed such that ring-shaped channels having different radii have the same center. Each of the second circulation fluid channel 232 may communicate with each other. The second circulation fluid channel 232 may have a cross-sectional area greater than that of the first circulation fluid channel 231. The second circulation fluid channel 232 may be formed at the same height. The second circulation fluid channel 232 may be located below the first circulation fluid channel 231.

The second supply fluid channel 233 may upwardly extend from the first circulation fluid channel 231 and may be provided to a top surface of the body 230. The second supply fluid channel 243 may be provided in a number corresponding to the first supply fluid channel 221, and may connect the first circulation fluid channel 231 to the first supply fluid channel 221.

The first circulation fluid channel 231 may be connected to a heat transfer medium storage unit 231a through a heat transfer medium supply line 231b. The heat transfer medium may be stored in the heat transfer medium storage unit 231a. The heat transfer medium may include an inert gas. According to an embodiment, the heat transfer medium may include a helium He gas. The helium gas may be supplied to the first circulation fluid channel 231 through the supply line 231b, and may be supplied to the bottom surface of the substrate S through the second supply fluid channel 233 and the first supply fluid channel 221 sequentially. The helium gas may serve as a medium through which a heat transferred from the plasma to the substrate S is transferred to the electrostatic chuck 210.

The second circulation fluid channel 232 may be connected to a cooling fluid storage unit 232a through a cooling fluid supply line 232c. The cooling fluid may be stored in the cooling fluid storage unit 232a. A cooler 232b may be provided within the cooling fluid storage unit 232a. The cooler 232b may cool the cooling fluid to a predetermined temperature. Alternatively, the cooler 232b may be installed at the cooling fluid supply line 232c. The cooling fluid supplied to the second circulation fluid channel 232 through the cooling fluid supply line 232c may circulate along the second circulation fluid channel 232 to cool the body 230. The body 230 may cool the dielectric plate 220 and the substrate S together to maintain the substrate S at a predetermined temperature.

The body 230 may include a metal plate. The body 230 may function as a bottom electrode. In this case, the body 230 is connected to the bottom power supply unit 239. The bottom power supply unit 239 applies a power to the body 230, that is, the bottom electrode. The bottom power supply unit 239 includes three bottom power sources 236a, 237a, and 238a, and a matching unit 235. In an embodiment, two of the three bottom power sources may be a first frequency power source 236a and a second frequency power source 237a having a frequency of 10 MHz or less, and the other bottom power source may be a third frequency power source 238a having a frequency of 10 MHz or more. The switches 236b, 237b, and 238b may be connected to each of the three bottom power sources 236a, 237a, and 238a to be electrically connected to the bottom electrode according to on/off of the switches 236b, 237b, and 238b. The first frequency power source 236a and the second frequency power source 237a may control an ion energy, and the third frequency power source 238a may control a plasma density. The matching unit 225 is electrically connected to the first to third frequency power sources 236a, 237a, and 238a, and applies a frequency power of different sizes to the body 230 acting as a bottom electrode by matching the frequency power.

The focus ring 240 may be disposed in an edge region of the electrostatic chuck 210. The focus ring 240 may have a ring shape and may be disposed along the circumference of the dielectric plate 220. A top surface of the focus ring 240 may be stepped such that an outer portion 240a is higher than an inner portion 240b. The top surface inner portion 240b of the focus ring 240 may be positioned at the same height as the top surface of the dielectric plate 220. The inner portion 240b of the top surface of the focus ring 240 may support the edge region of the substrate S positioned outside the dielectric plate 220.

The outer portion 240a of the focus ring 240 may be provided to surround the edge region of the substrate S. The focus ring 240 may control the electromagnetic field so that the plasma density is uniformly distributed in an entire region of the substrate S. Accordingly, the plasma is uniformly formed over the entire area of the substrate S, so that each area of the substrate S may be uniformly etched. An edge impedance control circuit 600 may be connected to the focus ring 240. The edge impedance control circuit 600 may control an impedance of an edge electrode 291 included in the focus ring 240. Detailed configurations of the focus ring 240 and the edge impedance control circuit 600 will be described below.

The bottom cover 250 may be located at a bottom end of the substrate support assembly 200. The bottom cover 250 may be positioned to be upwardly spaced apart from the bottom surface of the chamber 100. The bottom cover 250 may have a space 255 having an open top surface formed therein.

An outer radius of the bottom cover 250 may have a same length as an outer radius of the body 230. In an inner space 255 of the bottom cover 250, a lift pin module (not shown) or the like for moving a returned substrate S from an external transfer member to the electrostatic chuck 210 may be positioned. The lift pin module (not shown) may be spaced apart from the bottom cover 250 by a predetermined distance. A bottom surface of the bottom cover 250 may be made of a metal material. In the inner space 255 of the bottom cover 250, air may be provided. Since air has a dielectric constant lower than that of an insulator, it may serve to reduce the electromagnetic field inside the substrate support assembly 200.

The bottom cover 250 may have a connection member 253. The connection member 253 may connect the outer surface of the bottom cover 250 to the inner wall of the chamber 100. A plurality of connection members 253 may be provided at the outer surface of the bottom cover 250 at regular intervals. The connection member 253 may support the substrate support assembly 200 inside the chamber 100. In addition, the connection member 253 may be connected to the inner wall of the chamber 100 so that the bottom cover 250 is electrically grounded. A first power line 223c connected to the first power source 223a, a second power line 225c connected to the second power source 225a, power lines 236c, 237c, 238c connected to three bottom power sources 236a, 237a, 238a, and a heat transfer medium supply line 231b connected to the heat transfer medium storage unit 231a, etc may be extended within the bottom cover 250 through the inner space 255 of the connecting line.

A plate 270 may be positioned between the electrostatic chuck 210 and the bottom cover 250. The plate 270 may cover a top surface of the bottom cover 250. The plate 270 may be provided with a cross-sectional area corresponding to the body 230. The plate 270 may include an insulator. According to an embodiment, one or more plates 270 may be provided. The plate 270 may serve to increase an electrical distance between the body 230 and the bottom cover 250.

The plasma generation unit 300 may excite a process gas in the chamber 100 into a plasma state. The plasma generation unit 300 may use a capacitively coupled plasma type plasma source. When a CCP type plasma source is used, the chamber 100 may include a top electrode 330 and a bottom electrode, that is, a body 230. The top electrode 330 and the bottom electrode 230 may be disposed parallel to each other in an up/down direction with a treating space interposed therebetween. The top electrode 330 as well as the bottom electrode 230 may receive an energy for generating the plasma by receiving the RF signal from a top power supply 310, and the number of the RF signals applied to each electrode is not limited to one as illustrated. An electric field is formed in a space between the two electrodes, and the process gas supplied to the space may be excited in a plasma state. The substrate treating process is performed using this plasma.

The gas supply unit 400 may supply a process gas into the chamber 100. The gas supply unit 400 may include a gas supply nozzle 410, a gas supply line 420, and a gas storage unit 430. The gas supply nozzle 410 may be installed at a center of a top surface of the chamber 100. A spray hole may be formed at a bottom surface of the gas supply nozzle 410. The injection port may supply a process gas into the chamber 100. The gas supply line 420 may connect the gas supply nozzle 410 and the gas storage unit 430. The gas supply line 420 may supply the process gas stored in the gas storage unit 430 to the gas supply nozzle 410. A valve 421 may be installed at the gas supply line 420. The valve 421 may open and close the gas supply line 420 and control a flow rate of the process gas supplied through the gas supply line 420.

A baffle unit 500 may be positioned between the inner wall of the chamber 100 and the substrate support assembly 200. The baffle 510 may be provided in an annular ring shape. A plurality of through holes 511 may be formed at the baffle 510. The process gas provided in the chamber 100 may pass through the through holes 511 of the baffle 510 and may be exhausted through the exhaust hole 102. A flow of the process gas may be controlled according to a shape of the baffle 510 and a shape of the through holes 511.

Figure 2:
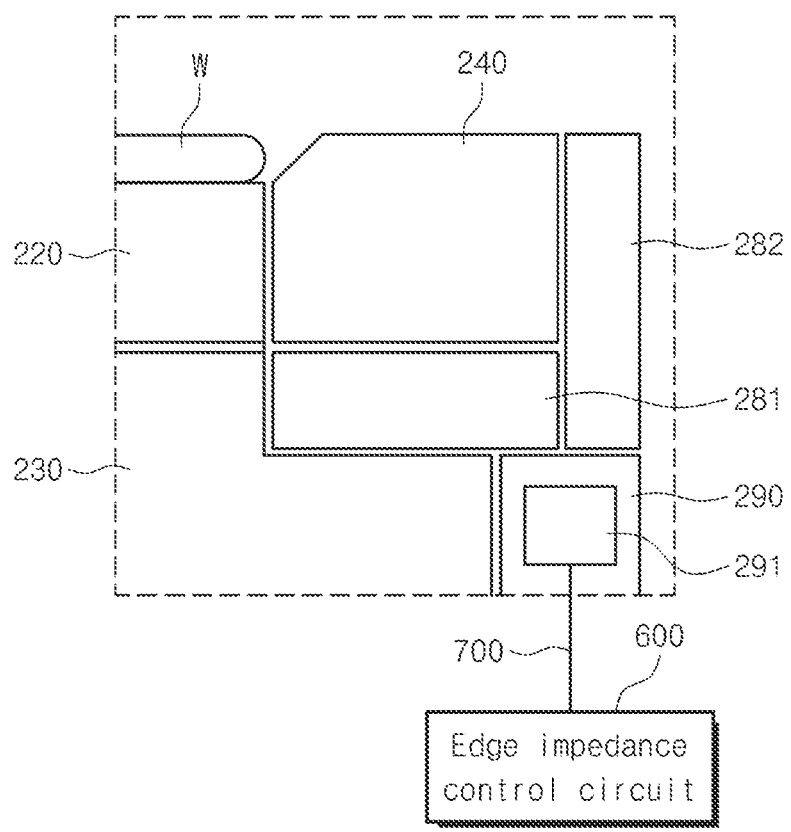
FIG. 2 is a further enlarged view of the substrate treating apparatus according to an embodiment of the inventive concept.

FIG. 2 is a further enlarged block diagram of the substrate treating apparatus according to an embodiment of the inventive concept.

The support unit 200 according to the inventive concept may include a focus ring 240 surrounding the substrate W and a coupling ring 290 disposed below the focus ring 240. Between the focus ring 240 and the coupling ring 290, insulators 281 and 282 may be included. According to an embodiment of FIG. 2, two insulators 281 and 282 may be provided, but may be combined to be provided as one insulator.

An electrode 291 may be included in the coupling ring 290. An edge impedance control circuit 600 may be connected to the electrode 291 included within the coupling ring 290. The edge impedance control circuit 600 and the electrode 291 included in the coupling ring 290 may be electrically connected to each other through the RF cable 700. The edge impedance control circuit 600 may provide an impedance path to the ground to an RF signal received in the edge region of the substrate W. The RF signal may flow to the electrode 291 through a capacitance between the focus ring 240 and the electrode 291. The electrode 291 may output the RF signal.

The substrate treating apparatus according to the inventive concept may include a top electrode 330 and a bottom electrode 230 disposed to face each other with a space in which plasma is generated in the process chamber 100, a top power source 310 applying a power to the top electrode 330, and three bottom power sources 236a, 237a, and 238a applying a high frequency power each having different frequencies to the bottom electrode 230.

The three bottom power sources 236a, 237a, and 238a are high-frequency power sources that apply a high-frequency power to the bottom electrode 230, the two high-frequency power sources may have a frequency of 10 MHz or less, and the one other high-frequency power source may have a frequency of 10 MHz or less.

In accordance with this invention, the three high frequency power sources may include a first frequency power source 236a and a second frequency power source 237a having a frequency in the range of 50 KHz to 10 MHz, and a third frequency power source 238c having a frequency in the range of 10 MHz to 100 MHz. In this case, the first frequency power source 236a and the second frequency power source 237a may control an ion energy incident on the substrate. A frequency of 10 MHz or less has a high impedance in a vacuum chamber and is applied to a plasma sheath in which only ions exist, thereby increasing the ion energy to increase an etching rate by ions incident on the substrate. The third frequency power supply 238c may improve the plasma density. That is, as a high frequency of 10 MHz or more is applied, a plasma sheath region is reduced, and thus the ion energy is also reduced. Accordingly, a power lost to ions is reduced, and thus a power applied from the third frequency power source 238c having a frequency of 10 MHz or more may serve to improve the plasma density.

In the inventive concept, in order to obtain a high inclination of an aspect ratio etching profile, the first frequency power source 236a and the second frequency power source 237a may be adjusted to obtain a higher ion energy distribution.

That is, in the inventive concept, an ion energy distribution may be adjusted through a frequency adjustment of the first frequency power source 236a and the second frequency power source 237a and controlling of the edge impedance control circuit 600.

Figure 4:
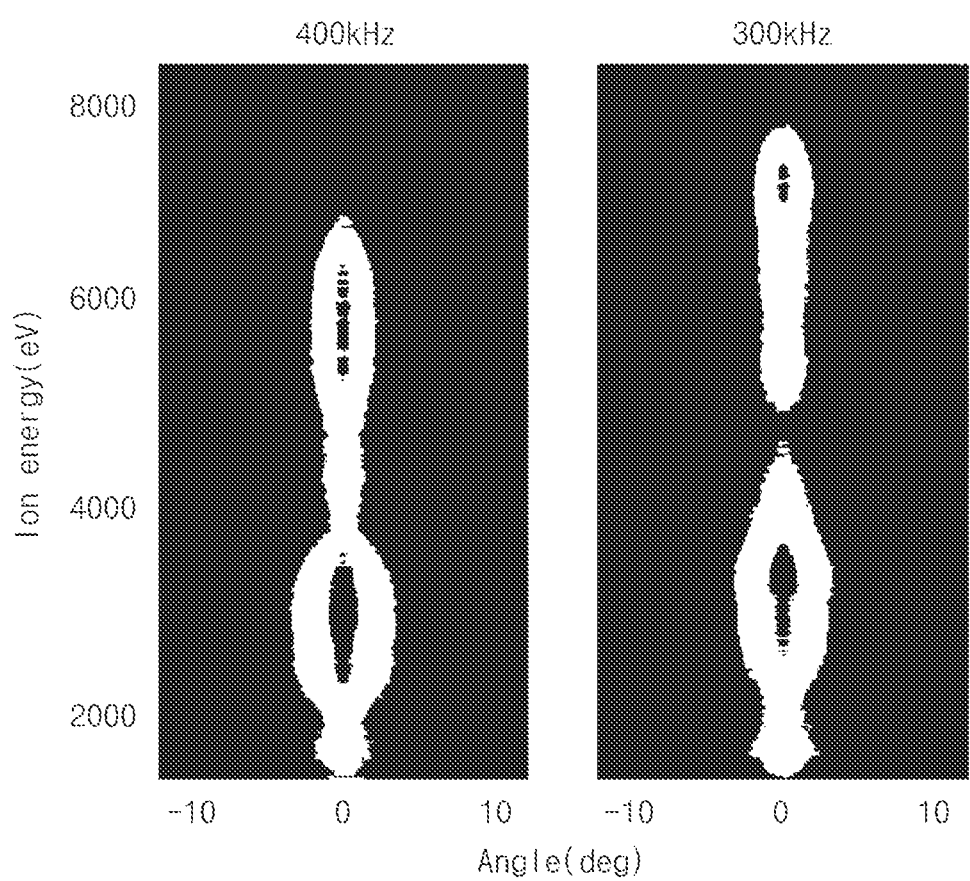
FIG. 4 is a view illustrating the ion energy distribution when a first frequency is changed in the substrate treating apparatus according to an embodiment of the inventive concept.

Referring to FIG. 4, a case is shown in which the frequency at the first frequency power source 236a is 400 kHz and 300 kHz. According to the exemplary example of FIG. 4, it can be seen that the ion energy increases by about 15% when the frequency at the first frequency power supply 236a decreases from 400 kHz to 300 kHz. That is, according to the inventive concept, the ion energy may be increased by adjusting a frequency of the first frequency power source 236a to a lower value within a predetermined range. In addition, among them, it can be confirmed through a simulation that a higher IED may be included by using a lower frequency.

An object of the inventive concept is to control an IED and to etch a HAR (high aspect ratio). For HAR etching without a deflection such as a bend, a twist, or an inclination, an object of the inventive concept is to obtain a higher IED and a uniform plasma.

A generation of harmonics in the CCP plasma generating apparatus generates a SWE that changes a plasma uniformity. Since harmonics of low and intermediate frequencies have negligible SWE due to larger wavelengths, the change in the plasma uniformity due to these changes in frequency is not large. However, in the case of a high frequency, even if there is a small change, a multiplication change is generated in the harmonic, and thus the SWE and the plasma uniformity may be greatly changed. That is, plasma that is not locally uniform may generate a twisting or a bending of the etching profile and lead to a failure of the chip architecture.

Therefore, in this invention, a higher ion energy distribution may be obtained within a range that does not impair the plasma uniformity by controlling only frequencies at the first frequency power source 236a and the second frequency power source 237a except for the highest frequency which comes from the third frequency power source 238a.

Figure 3A:
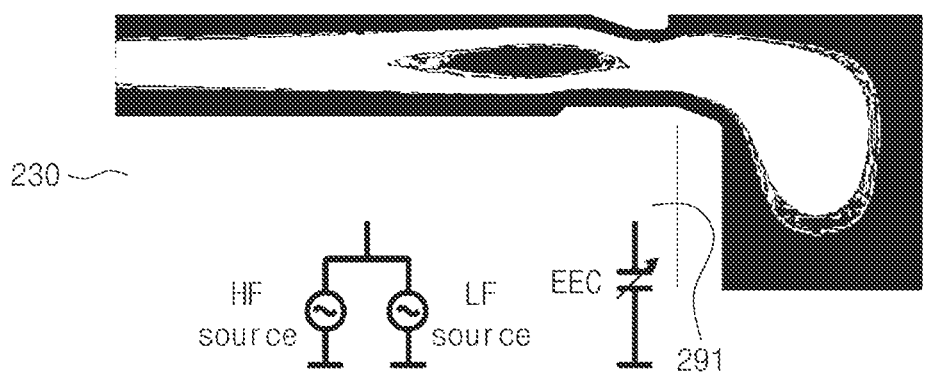
FIG. 3A to FIG. 3B are views illustrating an ion energy distribution in the substrate treating apparatus according to an embodiment of the inventive concept.
Figure 3B:
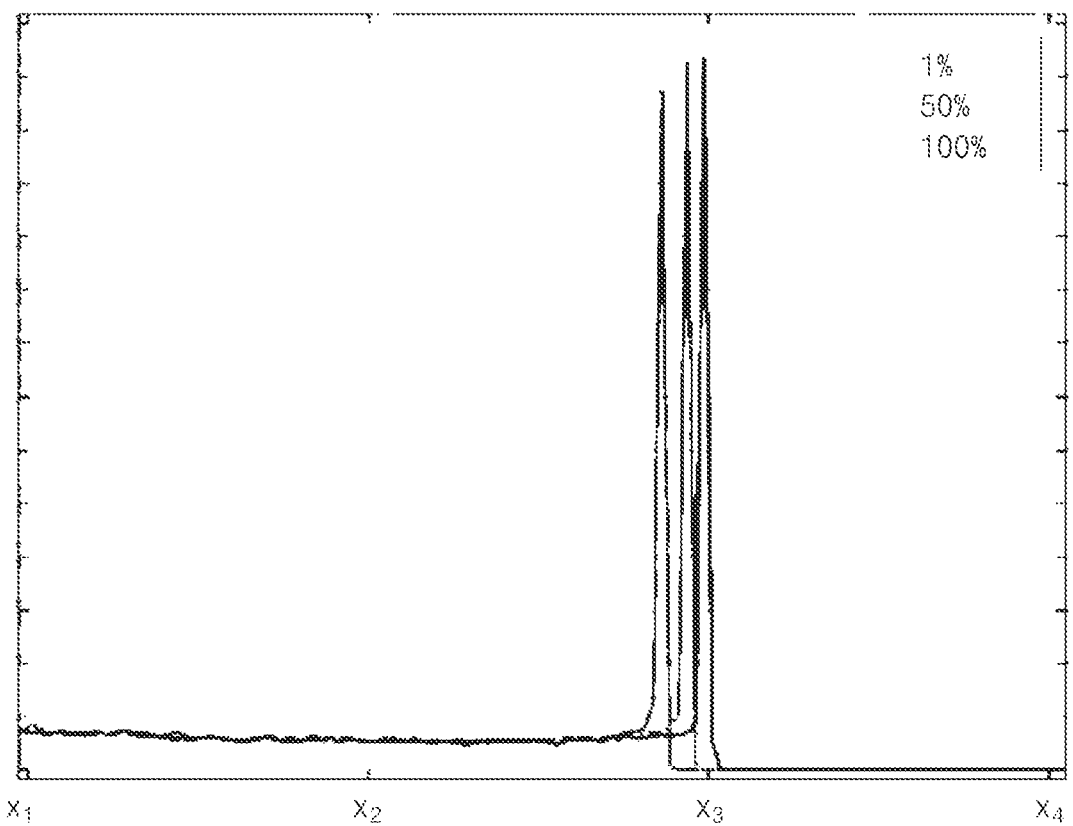

Referring to FIG. 3, it is shown that the IED may be controlled through tuning of the edge impedance control circuit 600. Referring to FIG. 3A, it may be seen that an ion energy density at the edge portion is concentrated. In addition, referring to FIG. 3B, a graph shows that the IED may be adjusted through tuning of the edge impedance control circuit 600. A horizontal axis of FIG. 3B represents a kinetic energy, and a vertical axis represents the IED. It appears that the kinetic energy and the IED can be additionally adjusted by adjusting the tuning ratio in a variable capacitor or a high pass filter of the edge impedance control circuit 600 to 1%, 50%, and 100%, respectively.

Figure 5:
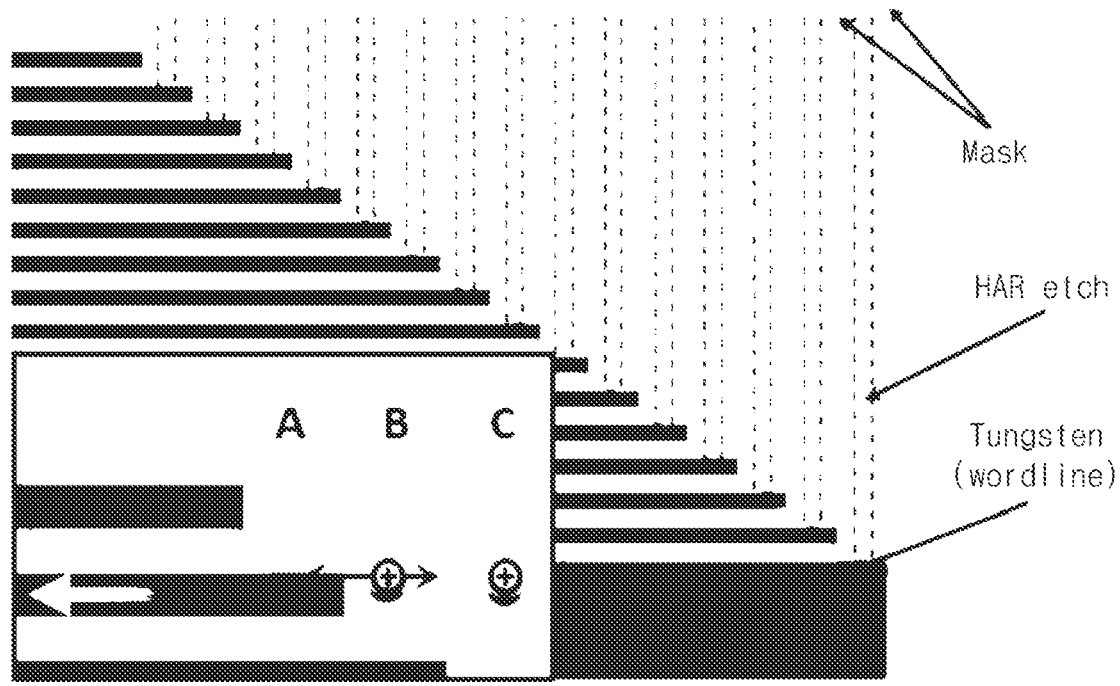
FIG. 5 is a view illustrating an etching profile inclination of a 3D-NAND due to a low ion energy.

FIG. 5 is a view illustrating an etching profile inclination of 3D-NAND due to a low ion energy.

With the development of technology, a structure of semiconductor manufacturing is becoming more and more complex. The highest aspect ratio in a conventional planar NAND architecture was about 15, but it represents an aspect ratio of 25 for a first generation and about 100 for the latest 3D-NAND. At an aspect ratio above 100, the etching profile shape takes a stochastic action and rarely avoids unexpected consequences such as a twisting, a bending, or a tilting during the etching. When the aspect ratio increases, a directivity and a shape of the profile can be arbitrarily changed by a polymer deposition and a charge accumulation of the sidewall, which weakens a vertical etching stability. In 3D-NAND, the charging effect of the tungsten word line makes the HAR etching more difficult, disturbing the local electric field. As the electric field is disturbed, ions are randomly driven, leading to the deflection and failure of etching profile. More specifically, a staircase structure of the 3D NAND architecture including the tungsten layer disturbs the electric field. Such a staircase structure in turn changes the balance of forces and deflects an ion trajectory. FIG. 5 illustrates bending of the etching profile due to a charging effect. During the etching, a bottom of the feature is filled with ions. When the etching feature contacts the tungsten line, ions diffused along the tungsten conductive layer are substantially discharged. Accordingly, the "C"ê repulsive force dominates the "A" ê force, and consequently, a bending of the "B" profile is observed. That is, an influence of ion tilting from an incomplete profile to a complete profile in HAR will be strengthened, and the etching profile is substantially inclined. Accordingly, when "B" contacts "A", 3D-NAND production may fail. In order to avoid the tilting problem discussed in FIG. 5, the ion driving force may be increased along the vertical direction.

Therefore, with respect to the HAR, a deflection solution must precisely control high energy ions during the etching process.

Figure 6:
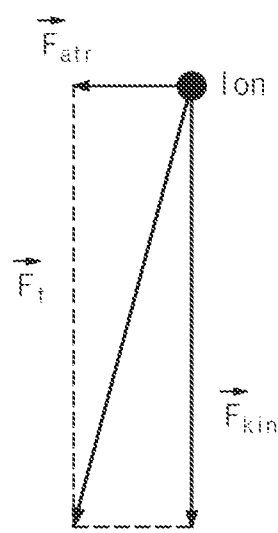
FIG. 6 is a view explaining a formation of a total driving force of ions.

FIG. 6 is a view for explaining a formation of a total driving force of ions.

In FIG. 6, Fatr represents a horizontal force by a gravitation, Fkin represents a vertical force by an ion kinetic energy, and Ft represents a total force acting on ions.

Referring to FIG. 6, an inclination angle may be reduced by increasing the ion kinetic energy. Such control of the ion kinetic energy may be achieved by controlling the plasma sheath (increase in ionic energy). Accordingly, the inventive concept proposes a configuration for controlling frequencies of the first frequency power source 236a and the second frequency power source 237a as a method for increasing the ion energy distribution at a high aspect ratio.

According to the inventive concept, it may be seen that a frequency change from 400 kHz to 300 kHz increases the IED by about 15%. The IED increases because the CCP impedance increases at a low frequency. A higher voltage drop across a CCP electrode at a fixed power corresponds to a higher load impedance, resulting in an increase in a sheath voltage, resulting in an increase in the IED. With the same concept, there is an effect of obtaining a higher IED by adjusting an intermediate frequency in the range of 9 to 10 MHz.

Additionally, the edge impedance control circuit 600 may control the impedance of the edge electrode 291. In the case of a floating edge electrode, an equivalent area of the bottom electrode is maximized due to a coupling between the electrostatic chuck and the edge electrode. When the impedance is small, the edge electrode potential approaches 0, so that the equivalent area of the bottom electrode may be reduced. This change can enable a tuning of the IED by the edge impedance control circuit 600, since a ratio of the top and bottom electrode is inversely proportional to the sheath voltage.

Figure 7A:
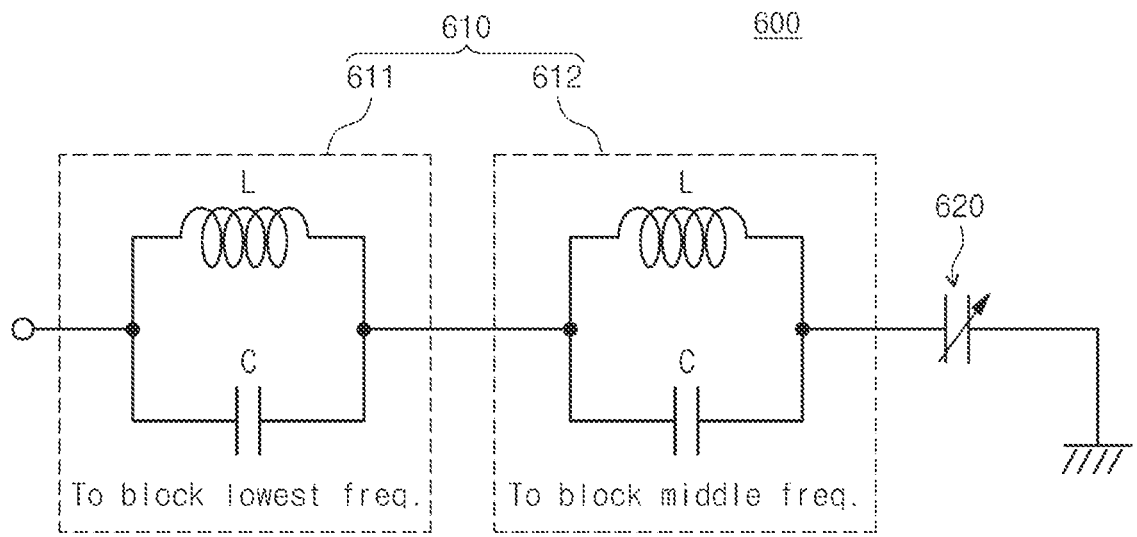
FIG. 7A to FIG. 7B are views illustrating an edge impedance control circuit according to an embodiment of the inventive concept.
Figure 7B:
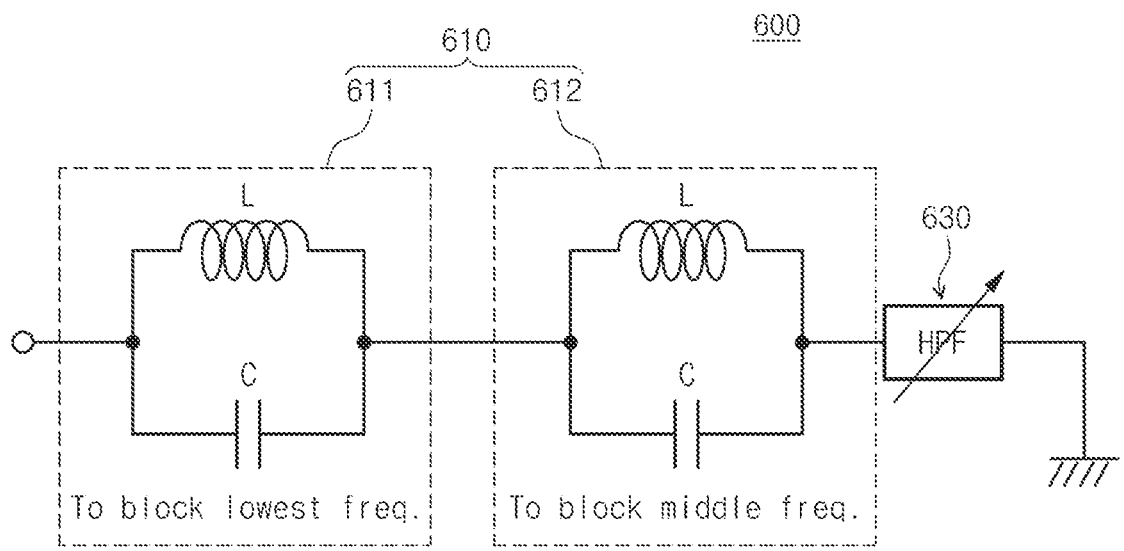

FIG. 7A to FIG. 7B are views illustrating the edge impedance control circuit 600 according to an embodiment of the inventive concept.

According to FIG. 7A, the edge impedance control circuit 600 according to an embodiment of the inventive concept may include one or more notch filters 610 and a variable capacitor 620 connected in series to one or more notch filters 610.

Referring to FIG. 7B, the edge impedance control circuit 600 according to an embodiment of the inventive concept may include one or more notch filters 610 and a high pass filter 630 connected in series to the one or more notch filters 610.

Referring to FIG. 7, the edge impedance control circuit 600 according to the inventive concept may include one or more notch filters 610 to avoid an impedance fluctuation at a first frequency and a second frequency. According to an embodiment of FIG. 7, a first notch filter 611 for blocking the first frequency and a second notch filter 612 for blocking the second frequency may be included.

Referring to FIG. 7A, the edge impedance control circuit 600 may include the variable capacitor 620 connected in series to the notch filter 610. The high frequency impedance may be controlled by adjusting a capacitance of the variable capacitor 620.

Referring to FIG. 7B, the edge impedance control circuit 600 may include a high pass filter 630 connected in series to the notch filter 610. The high pass filter 630 may include a controllable cutoff frequency to classify high-order harmonics and reduce a non-uniformity due to static wave effects. The high-pass filter 630 may control a shunting of high-frequency high-order harmonics.

In the inventive concept, an impedance of 60 MHz in an edge region may be adjusted through an impedance tuning at a high frequency. In addition, plasma characteristics inside the chamber may be changed, the IED may be adjusted, and there is an effect that no variation of the IAD is observed.

According to the inventive concept, using the substrate treating apparatus according to FIG. 1, the substrate may be treated in the substrate treating apparatus that generates the plasma inside the process chamber.

The inventive concept may include controlling a first frequency of the first frequency power source and a second frequency of the second frequency power source without controlling a third frequency of the third frequency power source applied to the bottom electrode; and blocking the first frequency and the second frequency, and controlling a high frequency impedance appearing due to the third frequency.

In this case, the step of the controlling the high frequency impedance appearing due to the third frequency is a step of tuning the edge impedance control circuit.

The first frequency may be controlled in a range of 100 kHz to 400 kHz, and the second frequency may be controlled in a range of 2 MHz to 10 MHz. The first frequency may be reduced from the first value to a second value smaller than the first value by control. Through this, there is an effect of maintaining a high aspect ratio and increasing an ion energy distribution.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a process chamber having a treating space therein;
   a support unit for supporting a substrate within the process chamber;
   a gas supply unit for supplying a process gas inside the process chamber; and
   a plasma generation unit for generating a plasma from the process gas,
   wherein the plasma generation unit comprises:
   a top electrode disposed above the substrate;
   a bottom electrode disposed below the substrate;
   an edge electrode disposed at an edge surrounding the substrate;
   three high frequency power sources configured to apply a high frequency power to the bottom electrode, the three high frequency power sources including a first frequency power source having a range between 100 kHz to 400 kHz, a second frequency power source having a range between 2 MHz to 10 MHz, and third frequency power source having a range of 60 MHz or higher; and
   an edge impedance control circuit connected to the edge electrode and including one or more notch filter(s), and a variable capacitor connected in parallel to the one or more notch filter(s).

2. The substrate treating apparatus of claim 1, wherein the one or more notch filter(s) block a frequency range of the first frequency power source and the second frequency power source, and the variable capacitor controls an impedance of the third frequency power source.

3. A substrate treating apparatus comprising:
a process chamber having a treating space therein;
a support unit for supporting a substrate within the process chamber;
a gas supply unit for supplying a process gas inside the process chamber; and
a plasma generation unit for generating a plasma from the process gas,
wherein the plasma generation unit comprises:
a top electrode disposed above the substrate;
a bottom electrode disposed below the substrate;
an edge electrode disposed at an edge surrounding the substrate;
three high frequency power sources configured to apply a high frequency power to the bottom electrode, the three high frequency power sources including a first frequency power source having a range between 100 kHz to 400 kHz, a second frequency power source having a range between 2 MHz to 10 MHz, and third frequency power source having a range of 60 MHz or higher; and
an edge impedance control circuit connected to the edge electrode and including one or more notch filter(s), and a high pass filter connected in parallel to the one or more notch filters(s).

4. The substrate treating apparatus of claim 3, wherein the one or more notch filter(s) block a frequency range of the first frequency power source and the second frequency power source, and the high pass filter controls an impedance of the third frequency power source and shunts a harmonics of the third frequency power source.

5. A substrate treating apparatus comprising:
a process chamber having a treating space therein;
a support unit for supporting a substrate within the process chamber;
a gas supply unit for supplying a process gas inside the process chamber; and
a plasma generation unit for generating a plasma from the process gas,
wherein the plasma generation unit comprises:
a top electrode disposed above the substrate;
a bottom electrode disposed below the substrate; and
three high frequency power sources configured to apply a high frequency power to the bottom electrode, the three high frequency power sources including a first frequency power source having a range between 100 kHz to 400 kHz, a second frequency power source having a range between 2 MHz to 10 MHz, and third frequency power source having a range of 60 MHz or higher; and
wherein the support unit comprises:
an edge ring surrounding the substrate;
a coupling ring disposed below the edge ring, and including an edge electrode therein; and
an edge impedance control circuit connected to the edge electrode and including one or more notch filter(s), and a variable capacitor connected in parallel to the one or more notch filter(s).

6. The substrate treating apparatus of claim 5, wherein the one or more notch filter(s) block a frequency range of the first frequency power source and the second frequency power source, and the variable capacitor controls an impedance of the third frequency power source.

7. A substrate treating apparatus comprising
a process chamber having a treating space therein;
a support unit for supporting a substrate within the process chamber;
a gas supply unit for supplying a process gas inside the process chamber; and
a plasma generation unit for generating a plasma from the process gas,
wherein the plasma generation unit comprises:
a top electrode disposed above the substrate;
a bottom electrode disposed below the substrate; and
three high frequency power sources configured to apply a high frequency power to the bottom electrode, the three high frequency power sources including a first frequency power source having a range between 100 kHz to 400 kHz, a second frequency power source having a range between 2 MHz to 10 MHz, and third frequency power source having a range of 60 MHz or higher; and
wherein the support unit comprises:
an edge ring surrounding the substrate;
a coupling ring disposed below the edge ring, and including an edge electrode therein; and
an edge impedance control circuit connected to the edge electrode and including one or more notch filter(s), and a high pass filter connected in parallel to the one or more notch filters(s).

8. The substrate treating apparatus of claim 7, wherein the one or more notch filter(s) block a frequency range of the first frequency power source and the second frequency power source, and the high pass filter controls an impedance of the third frequency power source and shunts a harmonics of the third frequency power source.

* * * * *